(12) United States Patent
Schubert

(10) Patent No.: US 10,032,947 B2
(45) Date of Patent: Jul. 24, 2018

(54) TWO-STAGE LIGHT CONCENTRATOR

(71) Applicant: X Development LLC, Mountain View, CA (US)

(72) Inventor: Martin F. Schubert, Mountain View, CA (US)

(73) Assignee: X Development LLC, Mountain View, CA (US)

(*) Notice: Subject to any disclaimer, the term of this patent is extended or adjusted under 35 U.S.C. 154(b) by 164 days.

(21) Appl. No.: 15/083,742

(22) Filed: Mar. 29, 2016

(65) Prior Publication Data

US 2017/0288079 A1    Oct. 5, 2017

(51) Int. Cl.
| | |
|---|---|
| H01L 31/044 | (2014.01) |
| H01L 31/055 | (2014.01) |
| G02B 19/00 | (2006.01) |
| H01S 3/0915 | (2006.01) |
| H01S 3/16 | (2006.01) |
| H01L 31/054 | (2014.01) |
| H01S 3/063 | (2006.01) |
| H01S 3/093 | (2006.01) |
| H01S 3/094 | (2006.01) |
| H01S 3/06 | (2006.01) |

(52) U.S. Cl.
CPC ............ *H01L 31/055* (2013.01); *G02B 19/00* (2013.01); *H01L 31/0547* (2014.12); *H01S 3/0915* (2013.01); *H01S 3/169* (2013.01); *H01S 3/063* (2013.01); *H01S 3/0612* (2013.01); *H01S 3/093* (2013.01); *H01S 3/09403* (2013.01); *Y02E 10/50* (2013.01)

(58) Field of Classification Search
CPC ........ H01L 31/00–31/078; Y02E 10/50–10/60

USPC .................................................. 136/243–265
See application file for complete search history.

(56) References Cited

U.S. PATENT DOCUMENTS 5,431,742 A *  7/1995  Kleinerman .......... H01L 31/055
                                                126/680
8,841,548 B2   9/2014  Giebink et al.
8,952,239 B2   2/2015  Pfenninger et al.
(Continued)

FOREIGN PATENT DOCUMENTS

WO    WO 2011/064311 A2    6/2011

OTHER PUBLICATIONS

Luminescent solar concentrator—Wikipedia, accessed Feb. 11, 2016, 7 pages.
(Continued)

*Primary Examiner* — Bach T Dinh
(74) *Attorney, Agent, or Firm* — Christensen O'Connor Johnson Kindness PLLC

(57) ABSTRACT

A light concentrator includes a luminescent concentrator and a gain medium. The luminescent concentrator includes a semiconductor material and the semiconductor material absorbs first photons. The first photons have energy greater than or equal to a threshold energy, and the semiconductor material emits second photons through a spontaneous emission process where the second photons have less energy than the first photons. The gain medium is optically coupled to the luminescent concentrator to receive the second photons. The gain medium absorbs the second photons, and in response to absorbing the second photons, the gain medium emits third photons through a stimulated emission process. The third photons have less energy than the second photons.

19 Claims, 9 Drawing Sheets

(56) References Cited

U.S. PATENT DOCUMENTS

| | | | |
|---|---|---|---|
| 9,256,018 B2 | 2/2016 | Morgan et al. | |
| 2009/0056791 A1* | 3/2009 | Pfenninger | H01L 31/055 136/247 |
| 2009/0272424 A1* | 11/2009 | Ortabasi | H01L 31/0543 136/246 |
| 2010/0065110 A1 | 3/2010 | Birdwell et al. | |
| 2010/0224248 A1* | 9/2010 | Kenney | H01L 31/055 136/259 |
| 2011/0240120 A1* | 10/2011 | Ronda | H01L 31/055 136/257 |
| 2012/0031466 A1* | 2/2012 | Bruer | H01L 31/055 136/246 |
| 2013/0128131 A1 | 5/2013 | Schmidt et al. | |
| 2013/0333755 A1 | 12/2013 | Lunt et al. | |
| 2014/0319377 A1* | 10/2014 | Morgan | H01L 31/0547 250/459.1 |
| 2015/0219975 A1 | 8/2015 | Phillips et al. | |
| 2016/0327714 A1* | 11/2016 | Patrick | H01L 31/055 |
| 2017/0271836 A1* | 9/2017 | Masuda | H01S 3/0915 |

OTHER PUBLICATIONS

Meinardi, F., et al.—Highly efficient large-area colourless luminescent solar concentrators using heavy-metal-free colloidal quantum dots, Nature Nanotechnology, Aug. 24, 2015, 9 pages.

Graham-Rowe, D.—Solar-powered lasers, Nature Photonics, Feb. 4, 2010, 2 pages.

Armstrong, S. et al.—Research Highlights, Nature Photonics, Sep. 2012, 1 page.

Meinardi, F. et al.—Large-area luminescent solar concentrators based on 'Stokes-shift-engineered' nanocrystals in a mass-polymerized PMMA matrix, Nature Photonics, Apr. 13, 2014, 8 pages.

Solar-pumped laser—Wikipedia, accessed Feb. 11, 2016, 3 pages.

International Search Report and Written Opinion of the International Searching Authority dated Apr. 5, 2017, for International Application No. PCT/US2016/067056, filed Dec. 15, 2016, 6 pages.

* cited by examiner

TWO-STAGE LIGHT CONCENTRATOR

TECHNICAL FIELD

This disclosure relates generally to wavelength conversion, and in particular but not exclusively, relates to light concentration.

BACKGROUND INFORMATION

Solar power involves the conversion of sunlight into electrical energy. Traditionally, this has been accomplished using photovoltaics, concentrated photovoltaics, and concentrated solar thermal devices.

Photovoltaics convert light into electric current using photons from the sun to separate electrons and holes in semiconductor p-n junctions. Energy generation using photovoltaics has long been viewed as a sustainable technology which utilizes a plentiful renewable energy source (the sun). Conversion of sunlight to electricity occurs without emission or chemical byproducts.

Concentrated solar thermal systems use lenses/mirrors and tracking systems to focus sunlight. Concentrator systems convert the sun's radiation to heat which powers steam turbines to generate electricity. Many concentrating technologies exist, for example: parabolic trough, Fresnel reflector, Stirling dish, and solar tower.

While both photovoltaic and concentrator technologies are seeing large scale adoption, both have drawbacks limiting commercial viability. Most competitive photovoltaics must be fabricated from expensive highly-pure semiconductor components. Similarly, concentrator systems often use large/expensive tracking systems and precision machined mirrors and lenses.

BRIEF DESCRIPTION OF THE DRAWINGS

Non-limiting and non-exhaustive embodiments of the invention are described with reference to the following figures, wherein like reference numerals refer to like parts throughout the various views unless otherwise specified. The drawings are not necessarily to scale, emphasis instead being placed upon illustrating the principles being described.

DETAILED DESCRIPTION

Embodiments of an apparatus and method for two-stage light concentration are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1A:
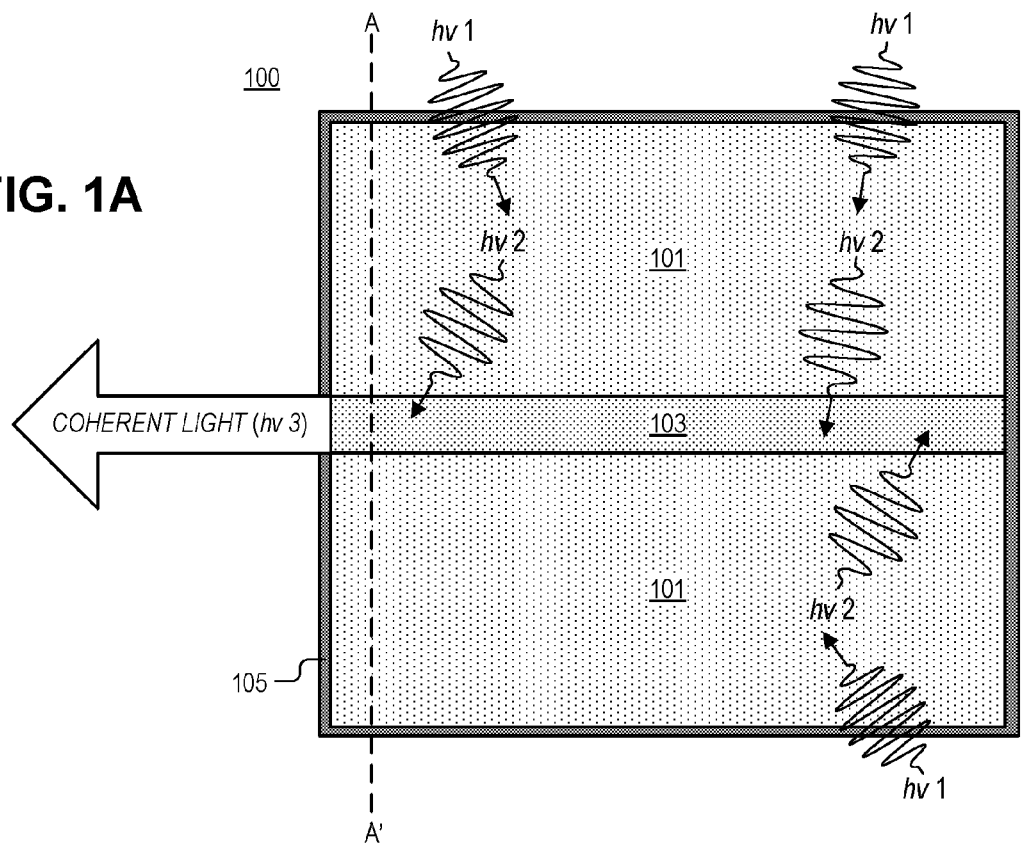
FIG. 1A is a top-down view of a light concentrator, in accordance with an embodiment of the disclosure.

FIG. 1A is a top-down view of light concentrator 100, in accordance with an embodiment of the disclosure. Light concentrator 100 includes: luminescent concentrator 101, gain medium 103, and reflective material 105. Generally speaking, light concentrator 100 may be used to convert sunlight into laser light by: (1) absorbing a portion of sunlight in luminescent concentrator 101; (2) using luminescent concentrator 101 to convert the sunlight into light with a longer wavelength (lower energy) than the absorbed portion of sunlight; (3) pumping gain medium 103 with the light from luminescent concentrator 101; and (4) producing laser light with gain medium 103. Energy produced by the laser may then be efficiently harvested to produce electrical energy (via photovoltaic or heat conversion), chemical energy, or the like.

In the depicted embodiment, luminescent concentrator 101 includes a semiconductor material (e.g., quantum dots). In one embodiment, the bulk of luminescent concentrator 101 is a transparent material (that exhibits internal reflection) with quantum dots disposed within it. As depicted, the semiconductor material absorbs first photons (hv 1). In response to absorbing the first photons, the semiconductor material emits second photons (hv 2) through a spontaneous emission process. The first photons have energy greater than or equal to a threshold energy, and the second photons have less energy than the first photons. In one embodiment, the threshold energy is the bandgap energy of the semiconductor material. Only first photons possessing the threshold energy may be able to excite electrons in the semiconductor material from the valance band to the conduction band.

Gain medium 103 is optically coupled to luminescent concentrator 101 to absorb the second photons. In one embodiment, gain medium 103 includes a semiconductor material with a band structure capable of maintaining electron population inversion (i.e., a semiconductor material suitable for use in a laser). In response to absorbing the second photons, gain medium 103 emits third photons (hv 3) through a stimulated emission process. The third photons have less energy than the second photons. In one embodiment, a population inversion of electrons occurs in gain medium 103 in response to gain medium 103 receiving a threshold quantity of second photons. This allows gain medium 103 to emit photons by a stimulated emission process which (with the appropriate structure) can act as a laser or as an amplified spontaneous emission source, once gain medium 103 is sufficiently optically pumped by second photons.

In the depicted embodiment, gain medium 103 is disposed between luminescent concentrator 101 and physically adhered to luminescent concentrator 101. Specifically, luminescent concentrator 101 includes two planar rectangles disposed along the sides of gain medium 103. Gain medium 103 runs through the center of luminescent concentrator 101. Thus, gain medium 103 is contained within a waveguide that provides for optical confinement of the third photons. In one embodiment, the waveguide could be defined by gain medium 103 having a higher refractive index than the surrounding material, or by cladding gain medium 103 with a low refractive index material (compared to the bulk of light concentrator 100).

Luminescent concentrator 101 and gain medium 103 may take any shape such that gain medium 103 is sufficiently optically pumped to result in stimulated emission of third photons. For example, luminescent concentrator 101 may only be disposed on one side of gain medium 103. Alternatively luminescent concentrator 101 may be disposed on opposite sides of gain medium 103 as in FIG. 1A, but luminescent concentrator 101 may not be rectangular and may take other shapes such as semicircular, parabolic, triangular, square, hexagonal or the like.

In some embodiments, gain medium 103 may be glued or chemically adhered to luminescent concentrator 101. In other embodiments, gain medium 103 may be attached by fusing gain medium 103 to luminescent concentrator 101. However, gain medium 103 may be attached to luminescent concentrator 101 in any way that facilitates the transfer of the second photons from luminescent concentrator 101 into gain medium 103.

As depicted, light concentrator 100 may include reflective material 105 disposed on the surface of luminescent concentrator 101 to prevent the first photons and the second photons from escaping luminescent concentrator 101. Reflective material 105 directs the first photons and the second photons into gain medium 103. Reflective material 105 may include a metal or other material with an index of refraction that promote reflection of light within luminescent concentrator 101. However, in another embodiment, not depicted, reflective material 105 may be absent since luminescent concentrator 101 may exhibit total internal reflection.

Figure 1B:
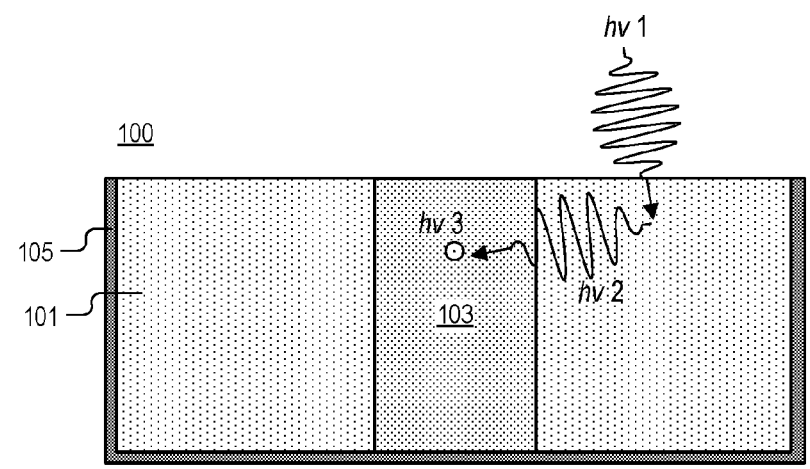
FIG. 1B is a cross section of the light concentrator in FIG. 1A, in accordance with an embodiment of the disclosure.

FIG. 1B is a cross section of light concentrator 100 in FIG. 1A, in accordance with an embodiment of the disclosure. As shown, luminescent concentrator 101 is disposed on opposite sides of gain medium 103. Reflective material 105 is deposed around the sides and bottom of luminescent concentrator 101 and gain medium 103 to prevent light from escaping light concentrator 100.

In the depicted embodiment, sunlight enters gain medium 103 from the top of light concentrator 100. Luminescent concentrator 101 converts photons from the sunlight into lower energy photons. Lower energy photons may all have a similar or the same wavelength. In one embodiment, conversion is achieved because quantum dots are disposed in luminescent concentrator 101, and the quantum dots absorb photons with energy greater than the bandgap of the quantum dot. The quantum dots then emit a photon (hv 2) with a wavelength that is proportional to the bandgap of the quantum dot. Gain medium 103 absorbs the photon and emits a third photon (hv 3, directed out of the page in the Z direction). It is appreciated that absorption and emission of photons is governed by the equation E=hv, where "E" is the energy of electromagnetic radiation, "h" is Planck's constant, and "v" is the frequency of electromagnetic radiation.

In another or the same embodiment, the bulk of luminescent concentrator 101 includes an inexpensive transparent material such as commercially available glasses/plastics. These glasses/plastics may be modified by adding semiconductor material such as organic small molecule/polymer dyes, quantum dots, giant shell-core quantum dots (including group II-VI or III-V compounds/elements), dot-in-rod quantum dots (including group II-VI or III-V compounds/elements), rare-earth-doped quantum dots/nanocrystals, chalcogenides, or the like. However, it should be noted that the materials listed above are not exhaustive and many other material compositions may be used to achieve the results described herein. The semiconductor material may be any material with a bandgap capable of absorbing (or emitting photons) above a threshold energy and being largely transparent to photons below this threshold energy.

Figure 1C:
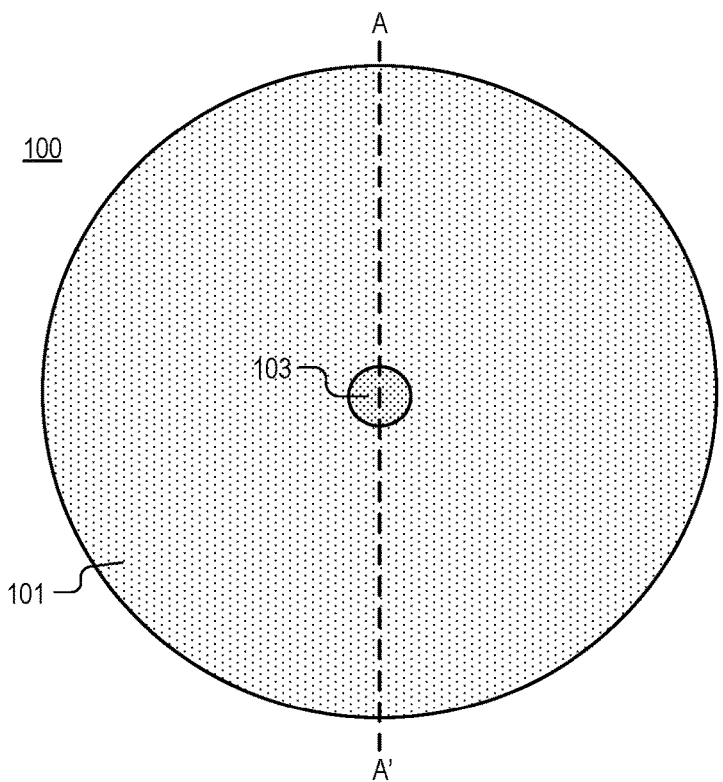
FIG. 1C is a frontal view of a light concentrator, in accordance with an embodiment of the disclosure.

FIG. 1C is a frontal view of a light concentrator 100, in accordance with an embodiment of the disclosure. Light concentrator 100 in FIG. 1C is similar to the light concentrator in FIGS. 1A-1B in that it includes all the same components (i.e., luminescent concentrator 101, gain medium 103, and reflective material 105); however, the configuration of these components is very different. As depicted, luminescent concentrator 101 and gain medium 103 are cylindrical. Gain medium 103 is disposed in the center of luminescent concentrator 101. Although the cross section of luminescent concentrator 101 and gain medium 103 is circular in this embodiment, in other embodiments the cross section may be triangular, square, hexagonal, octagonal, etc.

In one embodiment an antireflection coating/texturing may be disposed on all or some of the surface of luminescent concentrator 101. This may promote photon absorption. This antireflection coating/texturing may be included in other embodiments of the disclosure.

Figure 1D:
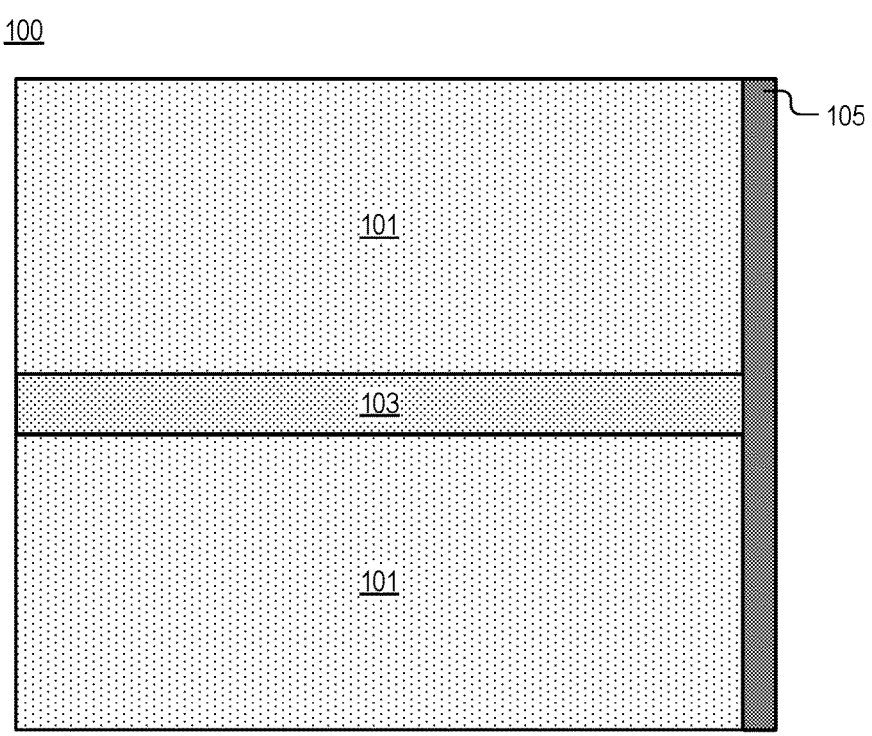
FIG. 1D is a cross section of the light concentrator in FIG. 1C, in accordance with an embodiment of the disclosure.

FIG. 1D is a cross section of light concentrator 100 of FIG. 1C, in accordance with an embodiment of the disclosure. As depicted reflective material 105 is disposed on one end of light concentrator 100. The other end of light concentrator 100 may be used to output laser light or amplified spontaneous emission. Although in the depicted embodiment, the length of light concentrator 100 is relatively short, it should be appreciated that depicted embodiment has not been drawn to scale and that light concentrator 100 may be any length or width. In one embodiment, light concentrator 100 may have a length to width ratio similar to a fiber/thread (diameter on the micron scale) so that light concentrator 100 may be woven into mats or arranged into rows. In other embodiments, light concentrator 100 may have a length to width ratio similar to that of a cable (e.g., diameter of several in/cm).

Figure 1E:
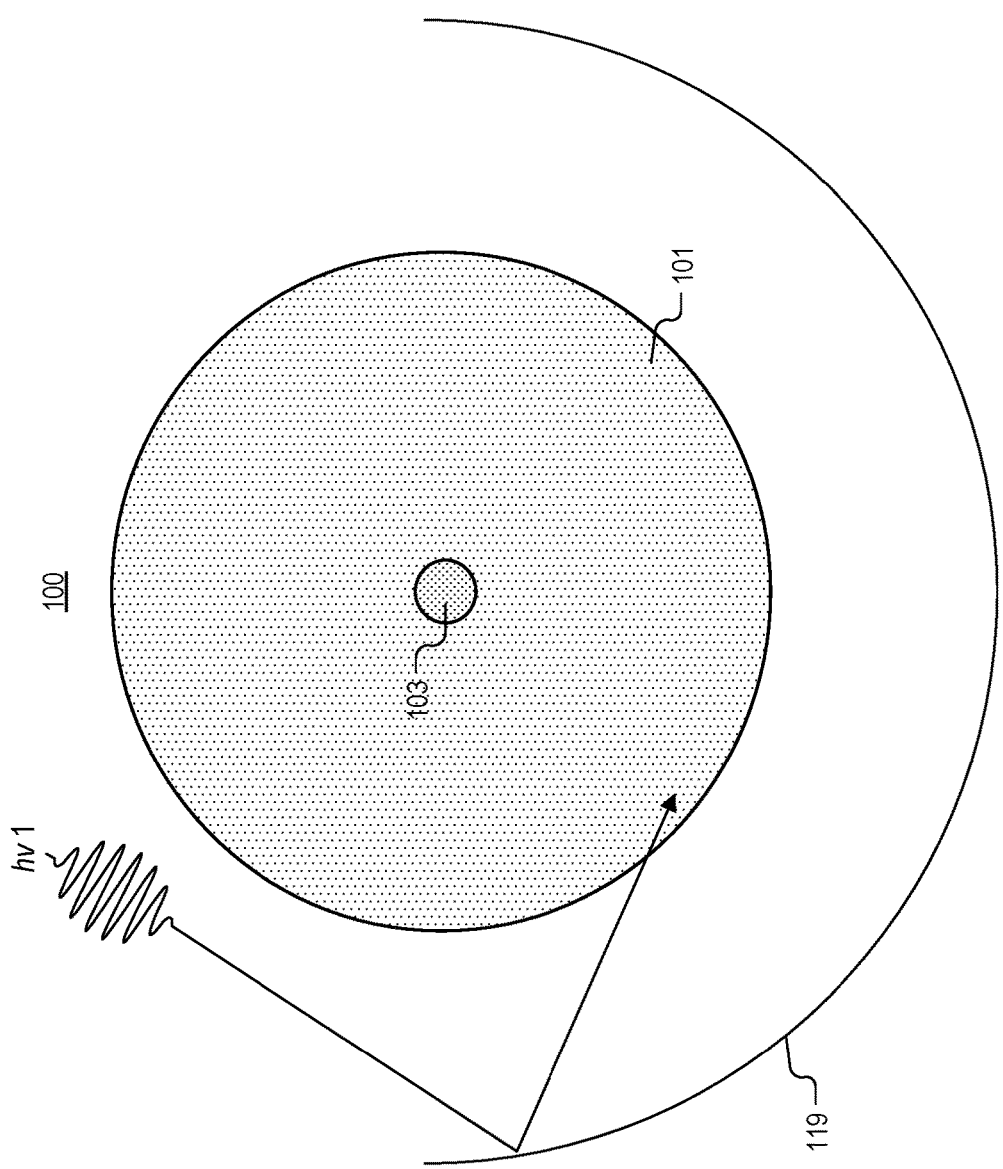
FIG. 1E is a frontal view of a light concentrator, in accordance with an embodiment of the disclosure.

FIG. 1E is a frontal view of a light concentrator 100, in accordance with an embodiment of the disclosure. Light concentrator 100 is similar to the light concentrator depicted in FIGS. 1C and 1D in that luminescent concentrator 101 and gain medium 103 are cylindrical. However, light concentrator 100 further includes a mirror 119 disposed to reflect light back into light concentrator 100. In the depicted embodiment, mirror 119 is semicircular; however, in other embodiments mirror 119 may be v-shaped, parabolic, or the like. One skilled in the relevant art will appreciate that mirror apparatuses can be included in all embodiments of the disclosure to increase the quantity of photons directed into light concentrator 100.

Figure 1F:
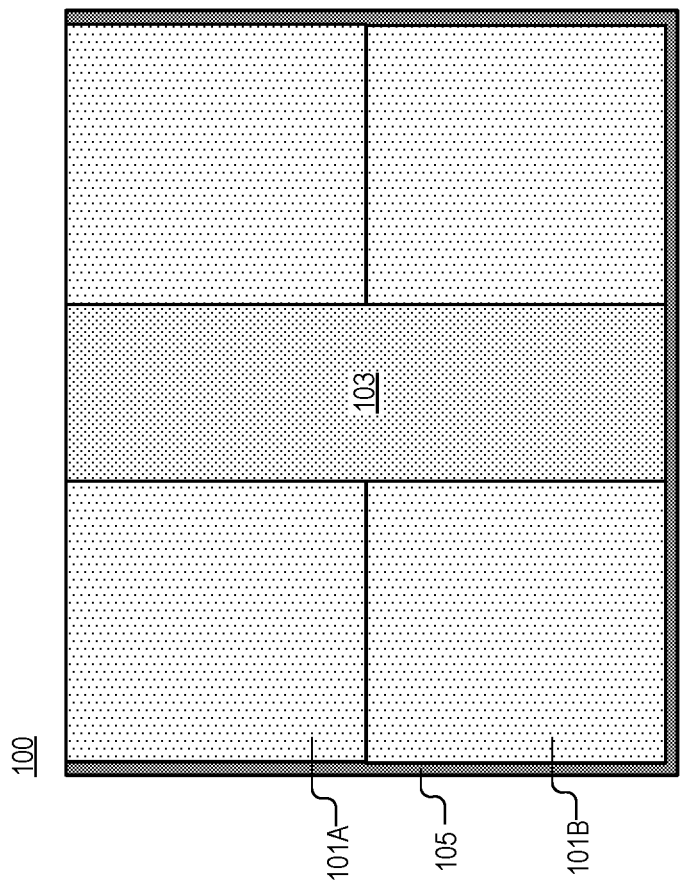
FIG. 1F is a cross section of a light concentrator, in accordance with an embodiment of the disclosure.

FIG. 1F is a cross section of light concentrator 100, in accordance with an embodiment of the disclosure. Light concentrator 100 is similar to the light concentrator depicted in FIG. 1A in that luminescent concentrator 101 and gain medium 103 are rectangular; however, light concentrator 100 includes a second luminescent concentrator 101B including a second semiconductor material to absorb the first photons. The second semiconductor material has a different density of states than the first semiconductor material. This embodiment allows luminescent concentrator 101 to absorb a wider range of light in the visible (and even the invisible spectrum) to further pump gain medium 103. By varying the bandgap of the semiconductor material used, a wider range of the EM spectrum may be absorbed. The depicted embodiment only includes two separate luminescent concentrators 101A and 101B; however, in other embodiments (not depicted) any number of luminescent concentrators 101 may be included to optimize first photon absorption by light concentrator 100. The various luminescent concentrators may also be separated by air gaps (or spaced by any lower-refractive-index material) and coated with wavelength-specific reflectors to minimize the probability of light generated in one concentrator entering a second concentrator.

Figure 2:
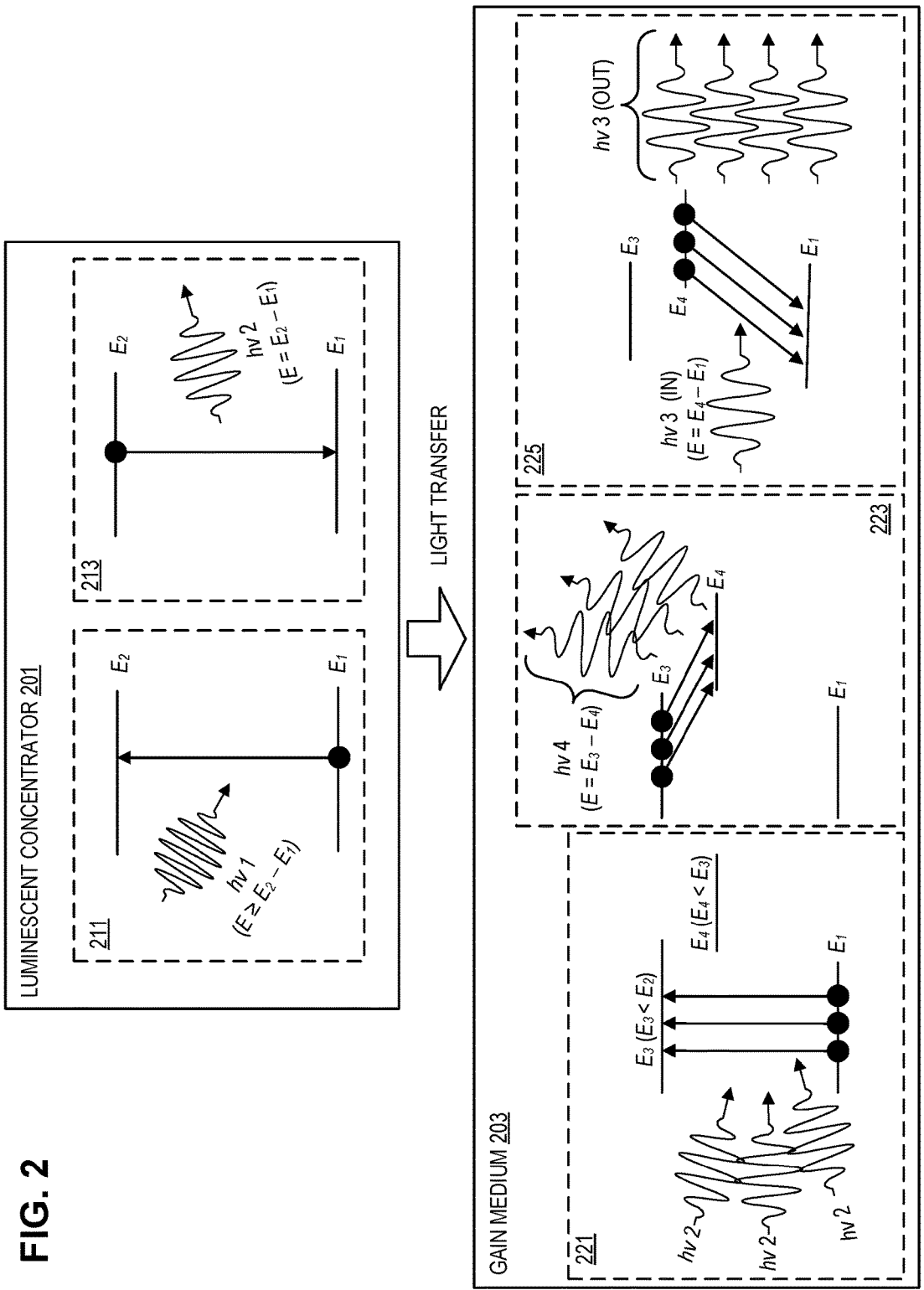
FIG. 2 is a band diagram illustrating the physics underlying the light concentrators in FIGS. 1A-1F, in accordance with several embodiments of the disclosure.

FIG. 2 is a band diagram illustrating the physics underlying light concentrator 100 in FIGS. 1A-1F, in accordance with several embodiments of the disclosure. It is worth noting that the band diagrams/method of light amplification have been broken into the physical processes occurring in luminescent concentrator 201 and gain medium 203. Each of these processes will be discussed in turn. However, one of ordinary skill in the art having the benefit of the present disclosure will understand that these process may be occurring at the same time when the device is in operation. Furthermore, the size of energy gaps depicted and specific energy values are arbitrary and may take any configuration.

Block 211 depicts receiving first photons (hv 1) with luminescent concentrator 201, and absorbing the first photons with a semiconductor material disposed in luminescent concentrator 201. The first photons have a first energy greater than or equal to a bandgap energy ($E_2-E_1$) of the semiconductor material. When absorption occurs, electrons in the semiconductor material are excited into a higher energy state ($E_2$).

Block 213 shows emitting second photons (hv 2) with the semiconductor material. The second photons have a second energy that is less than the first energy. In the depicted embodiment, emission occurs through a spontaneous emission process. In spontaneous emission, the electron falls from ($E_2$) back down to ($E_1$) and emits a photon with energy $hv=E_2-E_1$. This photon is emitted in a random direction.

The depicted embodiment shows a two-level system, where photons with energy above a minimum energy are absorbed, and photons with energy close to this minimum value are emitted. However, as one skilled in the art will appreciate, photon emission by the semiconductor material may involve electronics states that do not significantly contribute to the absorption behavior of the material. For instance, the semiconductor material may absorb blue and green light, but emit red light. In one embodiment, this may be achieved using a first semiconductor structure—which absorbs shorter wavelengths of light—electronically coupled to a second semiconductor structure—which emits longer wavelengths of light. In another or the same embodiment, the semiconductor material may include a giant-core-shell quantum dot, or a molecule having several dedicated emission centers.

Block 221 illustrates absorbing the second photons with gain medium 203. In the depicted embodiment, the energy of the second photons is greater than $E_3-E_1$.

Block 223 depicts electrons in gain medium 203 achieving population inversion after gain medium 203 absorbs a threshold quantity of the second photons. In a typical L.A.S.E.R (light amplification by stimulated emission) gain medium, electrons in the ground state are pumped to a first energy level (see block 211) by incoming photons. Then, electrons rapidly decay to the long-lived state ($E_4$) by emitting photons or lattice vibrations (hv 4). Because the $E_4$ states are long lived, they become heavily populated with electrons and there is a population inversion between $E_1$ and $E_4$.

Block 225 shows emitting third photons (hv 3) with gain medium 203. The third photons are emitted via a stimulated emission process, and the third photons have less energy than the second photons. Stimulated emission occurs when a random photon (from a spontaneous decay) initiates the decay of high energy electrons. The emitted photons are in phase with the incoming photon, have the same energy as the incoming photon, have the same direction as the incoming photon, and have the same polarization as the incoming photon. One can think of this process as the electric field of the incoming photon coupling to the high-energy electrons and driving the oscillation of the high-energy electrons with the same frequency as the incoming photon. This causes the electrons to decay and emit photons with the same energy as the incoming photon.

Figure 3:
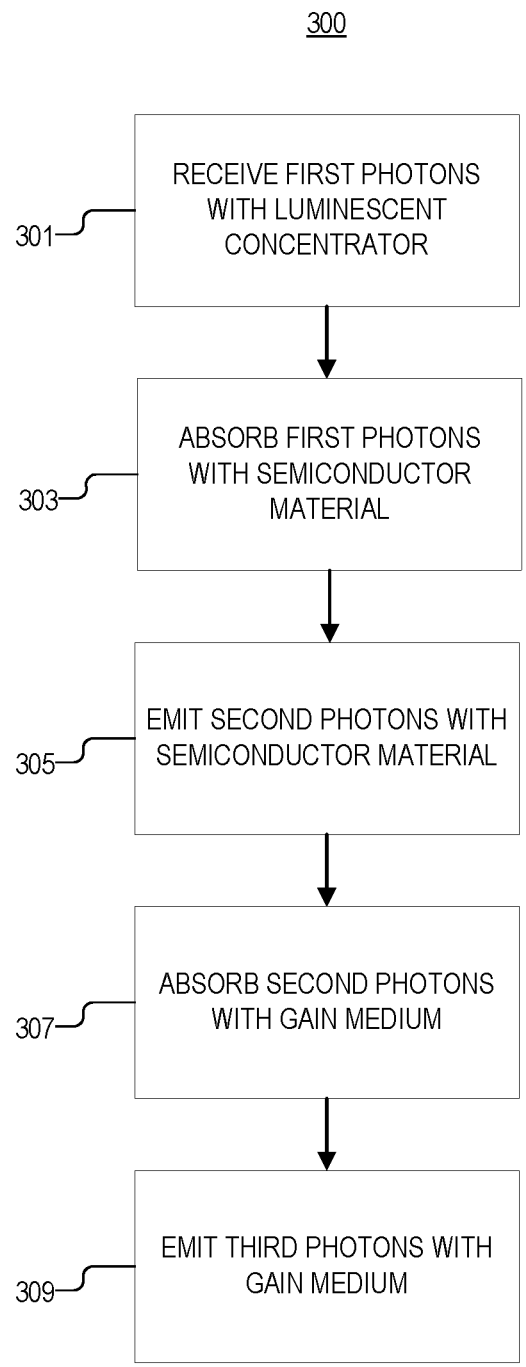
FIG. 3 is a flow chart describing a method of light concentration, in accordance with several embodiments of the disclosure.

FIG. 3 is a flow chart describing a method 300 of light concentration, in accordance with several embodiments of the disclosure. FIG. 3 is a generic method encompassing the embodiments depicted in FIGS. 1A-1F. The order in which some or all of process blocks 301-309 appear in method 300 should not be deemed limiting. Rather, one of ordinary skill in the art having the benefit of the present disclosure will understand that some of method 300 may be executed in a variety of orders not illustrated, or even in parallel.

Process block 301 depicts receiving first photons with a luminescent concentrator. In one embodiment, mirrors may be disposed around the luminescent concentrator to increase the number of photons received. In one or more embodiments, the first photons include sunlight.

Process block 303 illustrates absorbing first photons with a semiconductor material. This may involve absorbing photons with a higher energy (shorter wavelength) than the bandgap energy of the semiconductor material.

Process block 305 shows emitting second photons with the semiconductor material. Second photons have less energy than the first photons. In other words, each second photon has less energy (longer wavelength) than each first photon.

Process block 307 depicts absorbing the second photons with the gain medium. In one embodiment, the gain medium has a smaller bandgap energy than the semiconductor material.

Although not depicted, method 300 may also include outputting the third photons to a power converter and the power converter converts the third photons into electrical energy. In another embodiment, the third photons are output to a power converter, and the power converter converts the third photons into chemical energy. Alternatively, the third photons may be output to a laser emitter. The laser emitter may be used to cut materials, and/or perform other photomechanical or photochemical processes.

Figure 4A:
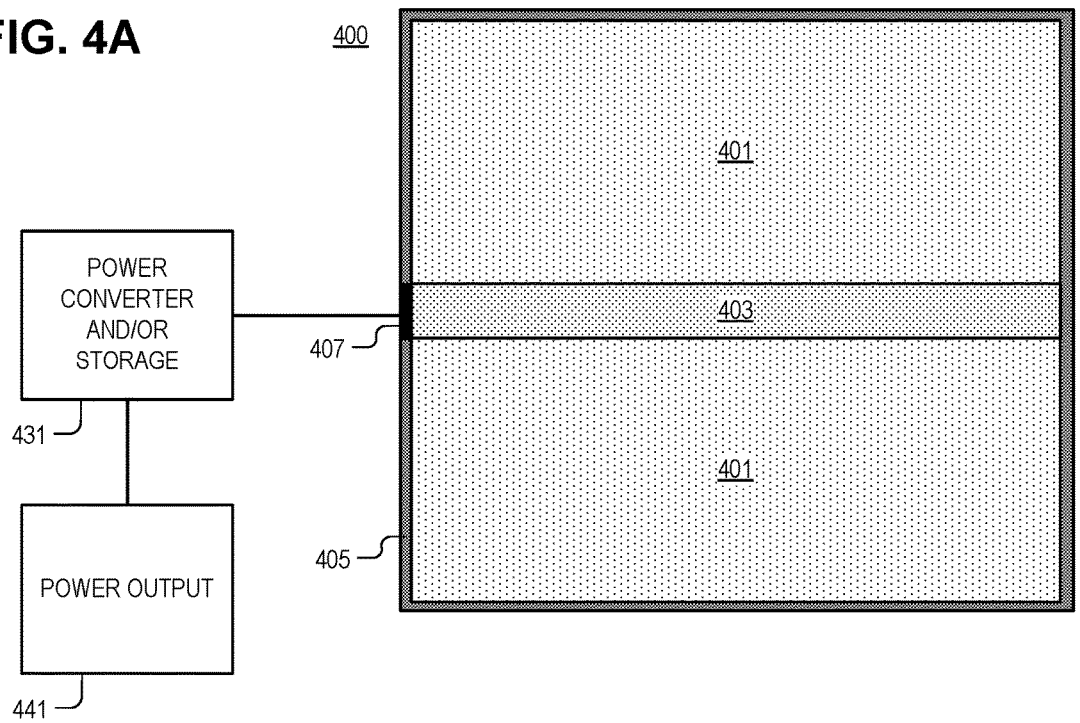
FIGS. 4A-4C illustrate power systems, in accordance with several embodiments of the disclosure.
Figure 4B:
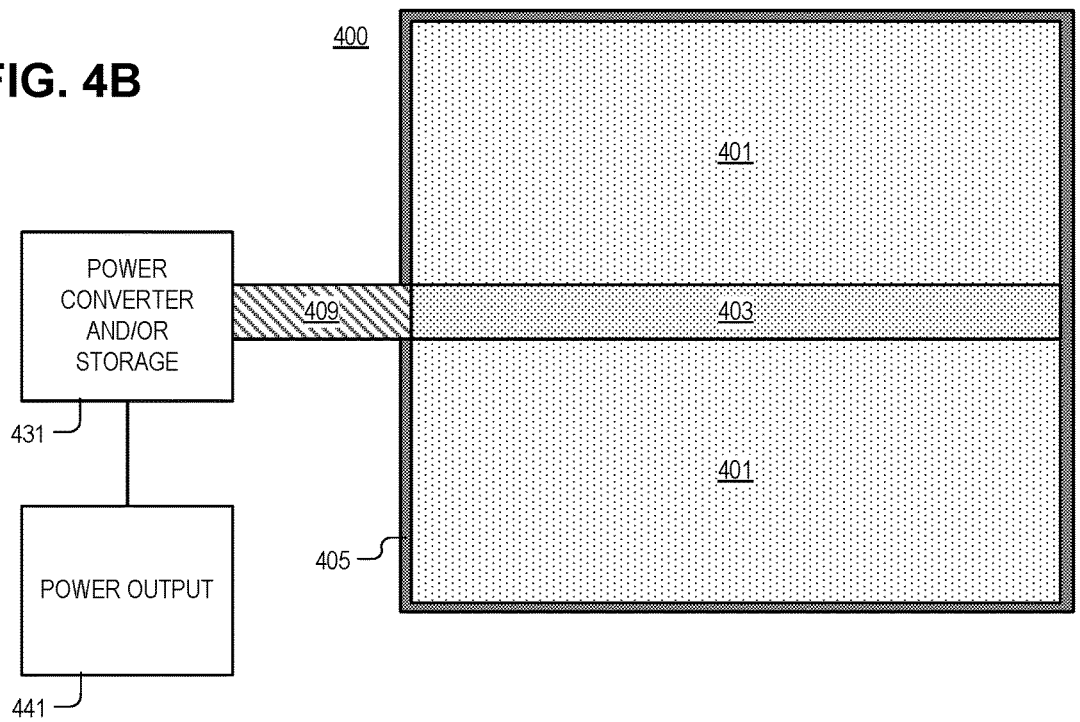
Figure 4C:
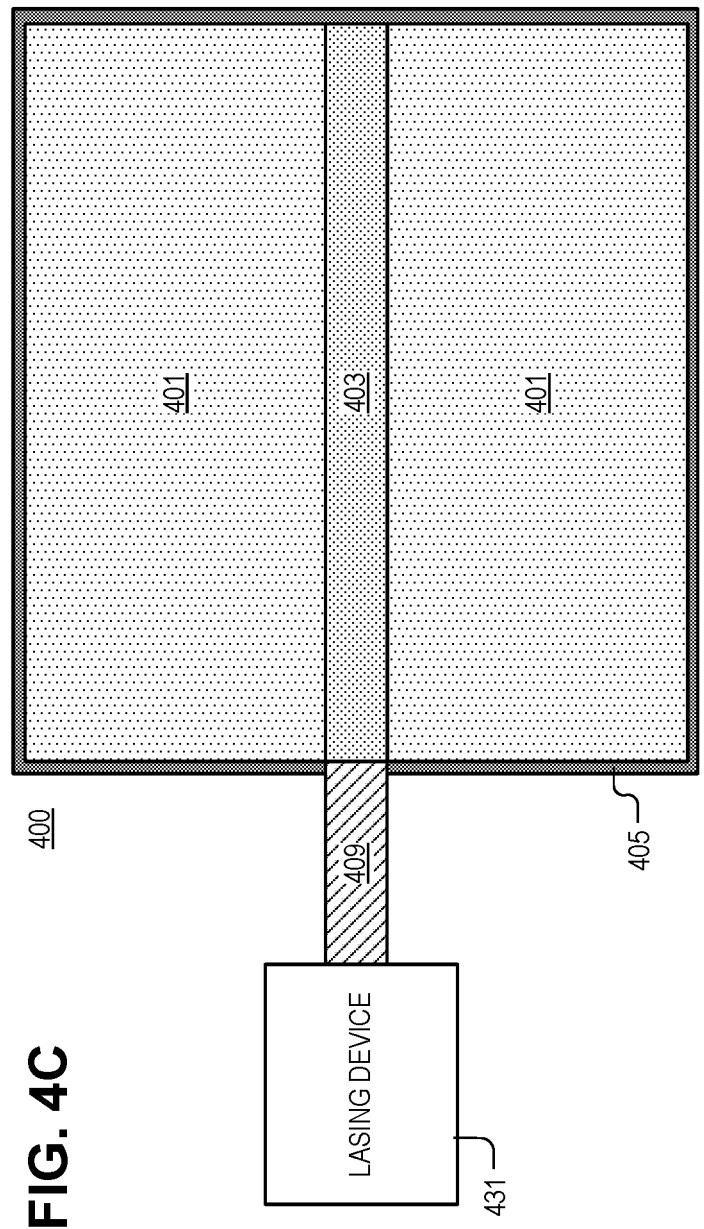

FIGS. 4A-4C illustrate power systems, in accordance with several embodiments of the disclosure. It should be noted that any of the components in FIGS. 1A-1F may be included in the power systems of FIGS. 4A-4C along with other components not depicted or discussed.

The power system in FIG. 4A includes: light concentrator 400, power converter and/or storage device 431, and power output 441. Light concentrator 400 includes luminescent concentrator 401 and gain medium 403. A semiconductor material in luminescent concentrator 401 absorbs first photons, and the first photons have energy greater than or equal to a bandgap energy of the semiconductor material. In response to absorbing the first photons, luminescent concentrator 401 emits second photons with less energy than the first photons. Gain medium 403 is also included in light concentrator 400 and is optically coupled to luminescent concentrator 401 to receive the second photons. In response to absorbing the second photons, gain medium 403 emits third photons through a stimulated emission process, where the third photons have less energy than the second photons. Power converter 431 is optically coupled to gain medium 403, and power converter 431 converts the third photons into another form of energy.

In the embodiment depicted in FIG. 4A, power converter 431 includes photovoltaic device 407 which is optically coupled to gain medium 403 to convert the third photons into electrical energy. In the depicted embodiment, photovoltaic device 407 is disposed on gain medium 403; however, in other embodiments photovoltaic device 407 may be disposed in the power converter 431 and may be optically coupled to gain medium 403 by a fiber optic cable, free space, or the like.

FIG. 4B shows another embodiment of a power system. The power system in FIG. 4B is similar to the power system in FIG. 4A in many respects. However, one noteworthy exception is that gain medium 403 is coupled to the power converter 431 by virtue of optical cable 409. Optical cable 409 may be disposed between the photovoltaic device and gain medium 403, and optical cable 409 facilitates optical coupling between the photovoltaic device and gain medium 403. Optical cable 409 transfers the third photons a distance from gain medium 403 to the photovoltaic device. In one embodiment, the distance may be inches, while in other embodiments the distance may be many miles.

As discussed above optical cable 409 may connect to a photovoltaic device to convert the third photons to electricity. However in other embodiments, power converter 431 may convert third photons into heat which then can be used to power a steam turbine or the like. For example, third photons may be directed through optical cable 409 and onto a highly optically absorbent material. The absorbent material may be thermally coupled to a fluid reservoir which may be used to power a turbine when heated. Alternatively, the absorbent material may be coupled to a thermoelectric (or other device) to convert heat into electrical energy. Once skilled in the art will appreciate that gain medium 403 may be optically coupled to any device capable of converting third photons into electrical energy.

In one embodiment, power converter 431 includes a power storage device to store electrical energy generated by light concentrator 400. Power converter 431 may be a capacitor, battery, or the like. In another embodiment, the power storage device stores chemical energy. This may be achieved by using the third photons to induce photochemical reactions and create higher energy molecular structures.

FIG. 4C depicts another embodiment of a power system. The power system in FIG. 4C is similar to the power systems in FIG. 4A and FIG. 4B in many respects. However, one noteworthy exception is that gain medium 403 is coupled directly to lasing device 431. In this embodiment, laser light is not converted into electrical energy but rather directly used. Laser light may be used to cut or may be used to assist photochemical reactions. One skilled in the relevant art will appreciate that laser light has many uses which cannot be discussed exhaustively in this document. However, in one or more embodiments, the power system in FIG. 4C may be used as a conventional laser would be.

Figure 5:
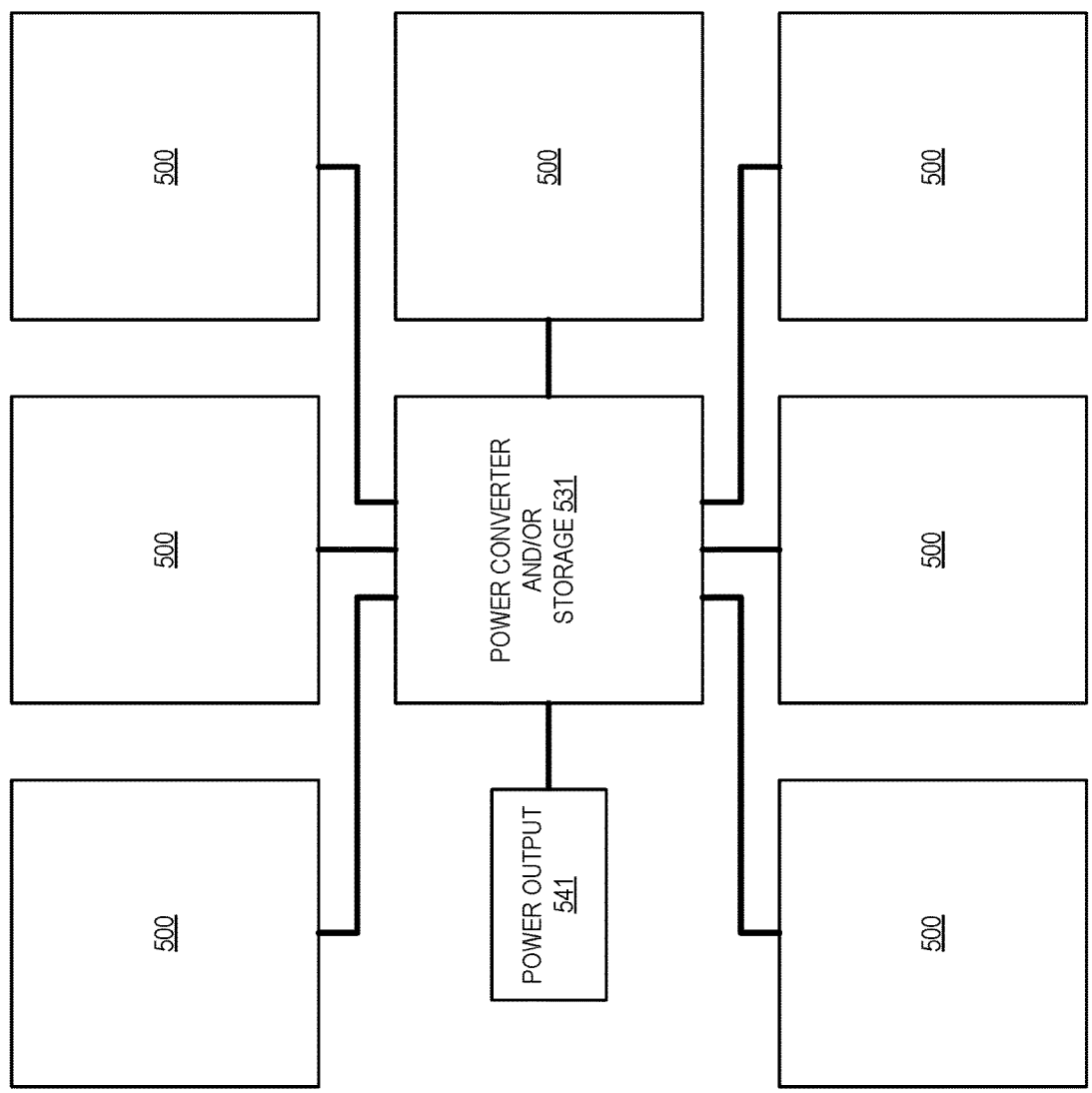
FIG. 5 illustrates a power system, in accordance with an embodiment of the disclosure.

FIG. 5 illustrates a power system, in accordance with an embodiment of the disclosure. In the depicted embodiment, a plurality of light concentrators 500 (e.g., the light concentrators depicted in FIGS. 1A-1F) are disposed in an array around power converter 531. Although the depicted embodiment includes seven light concentrators 500 connected to power converter 531, in other embodiments any number of light concentrators may be connected to power converter 531. The plurality of light concentrators 500 may be electrically or optically coupled to the power converter 531. The plurality of light concentrators 500 may be very close to power converter 531 (inches) or may be disposed far away (miles) from power converter 531. Power converter 531 may also convert the input power into waveforms compatible with modern/conventional electronic devices.

Power may be extracted from power converter 531 via power output 541. Power output 541 may be compatible with modern electronics, wall socket prongs, etc. Power output 541 may be coupled to any electronic device or power infrastructure (e.g., the power system may be coupled to a residential house to provide solar power to the house and connected grids).

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A light concentrator, comprising:
    a luminescent concentrator including a semiconductor material that absorbs first photons, wherein the first photons have energy greater than or equal to a threshold energy, and wherein, in response to absorbing the first photons, the semiconductor material emits second photons through a spontaneous emission process, wherein the second photons have less energy than the first photons;
    a second luminescent concentrator including a second semiconductor material to absorb the first photons, wherein the second semiconductor material has a different density of states than the semiconductor material, and wherein the second semiconductor material emits the second photons;
    a gain medium optically coupled, and physically adhered, to the luminescent concentrator and the second luminescent concentrator to receive and absorb the second photons, wherein the gain medium is coupled to emit third photons through a stimulated emission process in response to absorbing the second photons, and wherein the third photons have less energy than the second photons; and an optical cable with a first end coupled to the gain medium to transfer the third photons a distance from the gain medium.

2. The light concentrator of claim 1, wherein the first photons include sunlight, and wherein the threshold energy is equal to a bandgap energy of the semiconductor material.

3. The light concentrator of claim 1, wherein a population inversion of electrons occurs in the gain medium in response to the gain medium receiving a threshold quantity of second photons.

4. The light concentrator of claim 1, further comprising a reflective material disposed on a surface of the luminescent concentrator to prevent the first photons and the second photons from escaping the luminescent concentrator, and wherein the reflective material directs the first photons and the second photons into the gain medium.

5. The light concentrator of claim 1, wherein the gain medium is disposed within the luminescent concentrator.

6. The light concentrator of claim 1, wherein the luminescent concentrator includes a transparent material, and the semiconductor material includes semiconductor particles disposed in the transparent material.

7. The light concentrator of claim 6, wherein the semiconductor material includes quantum dots.

8. A power system, comprising:
a light concentrator including:
    a luminescent concentrator including a semiconductor material that absorbs first photons, wherein the first photons have energy greater than or equal to a bandgap energy of the semiconductor material, wherein, in response to absorbing the first photons, the semiconductor material emits second photons with less energy than the first photons;
    a second luminescent concentrator including a second semiconductor material to absorb the first photons, wherein the second semiconductor material has a different density of states than the semiconductor material, and wherein the second semiconductor material emits the second photons;
    a gain medium optically coupled, and physically adhered, to the luminescent concentrator and the second luminescent concentrator to receive and absorb the second photons, wherein the gain medium is coupled to emit third photons through a stimulated emission process in response to absorbing the second photons, and wherein the third photons have less energy than the second photons;
an optical cable with a first end coupled to the gain medium to transfer the third photons a distance from the gain medium; and
a power converter coupled to a second end of the optical cable to convert the third photons into another form of energy.

9. The power system of claim 8, wherein the power converter includes a photovoltaic device optically coupled to the gain medium to convert the third photons into electrical energy.

10. The power system of claim 8, wherein the power converter includes power storage that stores electrical energy or thermal energy generated by the light concentrator.

11. The power system of claim 8, further comprising a plurality of light concentrators including the light concentrator, wherein the plurality of light concentrators is coupled to the power converter with a plurality of optical cables including the optical cable.

12. The power system of claim 8, wherein the power converter converts the third photons into chemical energy.

13. The power system of claim 12, wherein the power converter includes power storage that stores the chemical energy.

14. A method of light concentration, comprising:
receiving first photons with a luminescent concentrator including a semiconductor material;
absorbing the first photons with the semiconductor material, wherein the first photons have a first energy greater than or equal to a bandgap energy of the semiconductor material;
emitting second photons with the semiconductor material, wherein the second photons have a second energy that is less than the first energy;
receiving the first photons with a second luminescent concentrator including a second semiconductor material which has a different density of states than the semiconductor material;
absorbing the first photons with the second semiconductor material, wherein the first photons have a first energy greater than or equal to a second bandgap energy of the second semiconductor material;
emitting the second photons with the second semiconductor material, wherein the second photons have a second energy that is less than the first energy;
absorbing the second photons with a gain medium that is optically coupled and physically adhered to the luminescent concentrator and the second luminescent concentrator, wherein electrons in the gain medium achieve population inversion after the gain medium absorbs a threshold quantity of the second photons; and
emitting third photons from the gain medium via a stimulated emission process, wherein the third photons have less energy than the second photons;
transporting the third photons a distance from the gain medium using an optical cable, wherein a first end of the optical cable is coupled to the gain medium; and
receiving the third photons with a power converter coupled to a second end of the optical cable, wherein the power converter converts the third photons into electrical energy.

15. The method of claim 14, wherein emitting second photons with the semiconductor material includes emitting the second photons through a spontaneous emission process.

16. The method of claim 14, wherein groups of photons in the third photons are coherent, in phase, and have a same polarization.

17. The light concentrator of claim 1, wherein the luminescent concentrator includes a glass or a plastic including organic dye molecules.

18. The light concentrator of claim 7, wherein the quantum dots include at least one of shell-core quantum dots or dot-in-rod quantum dots.

19. The light concentrator of claim 1, further comprising at least one of an antireflection texturing or an antireflection coating disposed on the surface of the luminescent concentrator.

* * * * *